United States Patent
Chen et al.

(10) Patent No.: US 6,617,650 B1
(45) Date of Patent: Sep. 9, 2003

(54) ELECTROSTATIC DISCHARGE PROTECTION DEVICE

(75) Inventors: Shiao-Shien Chen, Hsin-Chu (TW); Tien-Hao Tang, Taipei Hsien (TW); Chiu-Hsiang Chou, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/248,187

(22) Filed: Dec. 25, 2002

(51) Int. Cl.[7] .............................................. H01L 21/332
(52) U.S. Cl. ........................................ 257/355; 257/356
(58) Field of Search ................................... 257/355, 356

(56) References Cited

U.S. PATENT DOCUMENTS 5,324,982 A * 6/1994 Nakazato et al.
6,462,380 B1 * 10/2002 Duvvury et al.
6,492,208 B1 * 12/2002 Cheng et al.

* cited by examiner

Primary Examiner—Stephen D. Meier
(74) Attorney, Agent, or Firm—Winston Hsu

(57) ABSTRACT

A diode device for an electrostaticdischarge (ESD) protection circuit includes a P-type substrate, a buried $N^+$ heavily doped semiconductor layer implanted in the P-type substrate and bounded by a deep trench isolation, a P well disposed above the buried $N^+$ heavily doped semiconductor layer in the P-type substrate and isolated from the P-type substrate by the deep trench isolation. A $P^+$ doped region, which serves as an anode of the diode device, is located in the P well. A $N^+$ doped region, which serves as a cathode of the diode device, is laterally disposed in the P well and spaced apart from the $P^+$ doped region. The $P^+$ doped region, the buried $N^+$ heavily doped semiconductor layer, and the P-type substrate constitute an open base parasitic PNP bipolar transistor.

11 Claims, 3 Drawing Sheets

ELECTROSTATIC DISCHARGE PROTECTION DEVICE

BACKGROUND OF INVENTION

1. Field of the Invention

The present invention relates to an electrostaticdischarge (ESD) protection circuit. More particularly, the present invention relates to a structure of an electrostaticdischarge protection device having an open base parasitic bipolar transistor for reducing substrate leakage current. The electrostaticdischarge protection device according to the present invention is compatible with standard Bipolar/BiCMOS manufacturing processes and SiGe-BiCMOS manufacturing processes.

2. Description of the Prior Art

It has been known that extremely high voltages (e.g. 10,000 volts or greater) can develop in the vicinity of an integrated circuit (IC) due to the build-up of static charge. Electrostatic discharge (ESD) refers to the phenomenon whereby an electrical discharge of high current and short duration is produced at the package nodes of an integrated circuit, as a consequence of static charge build-up on that IC package or on a nearby body such as a human being or an IC handling machine. Electrostatic discharge is a serious problem for semiconductor devices since it has the potential to disable or destroy the entire integrated circuit. Because ESD events occur most often across the silicon circuits attached to the package nodes, circuit designers have concentrated their efforts on developing adequate protection mechanisms for these sensitive circuits. Ideally, an ESD protection device should be able to protect an IC against any conceivable static discharge by passing large currents in a short time in a nondestructive manner.

Diode strings have been used to couple peripheral power supplies to their corresponding core power supplies during ESD events. A typical example of a diode string would be a Vsso (e.g., a noisy output supply) double-clamped to core, or substrate, Vss. It is also known that the diode strings can be used in ESD protection between power pads (e.g. between Vcc1 and Vcc2; or between Vss1 and Vss2) or trigger circuit design. FIG. 1 is a cross-sectional view of a conventional diode clamp structure, which is made up of four diodes coupled in series. The diode is shown consisting of a set of separate structures disposed in substrate 10. Each diode structure includes a P$^+$ diffusion region and a N$^+$ diffusion region (P$^+$: 3a~3d and N$^+$: 4a~4d, respectively) disposed in a floating N-well (9a~9d, respectively). Each of the four separate N-well regions 9a~9d are formed in P-type substrate 10. By way of example, the first diode in the series comprises diffusion regions 3a and 4a, with P$^+$ diffusion region 3a being coupled to a drain voltage $V_D$ or a peripheral power supply Vccp.

The series connection of separate diodes, which comprise the diode clamp, are coupled together using any available metal layer. The metal connections are always from the N$^+$ region of the previous diode stage to the P$^+$ region of the next stage; that is, N$^+$ region 4a is coupled to P$^+$ region 3b, N$^+$ region 4b is coupled to P$^+$ region 3c, and so on. At the cathode terminal of the diode clamp, N$^+$ region 4d is grounded or coupled to an internal power supply Vcc.

The diode strings are designed to provide a current path during an electrostatic discharge event. However, the above-described prior art diode string structure suffers from a serious substrate leakage current problem. Referring to the first diode in the series of diode string illustrated in FIG. 1, by way of example, the substrate leakage current $I_{sub}$ ($I_{sub} = I_D \times \beta/(1+\beta)$, where $\beta$ is the current gain) occurs due to a parasitic PNP bipolar transistor consisting of the P$^+$ junction 3a, the N well 9a, and the P-type substrate 10. When the number of the diodes (or stages of the diode string) increase, the leakage gets worse. A total substrate leakage current $I_{sub, total}$ of a four-stage diode string as set forth in FIG. 1 can be expressed by the following equation:

$$I_{sub,\ total} = I_D \times \beta(1/(1+\beta) + 1/(1+\beta)^2 + 1/(1+\beta)^3 + 1/(1+\beta)^4)$$

where $I_D$ is the input current through the anode P$^+$ junction 3a and $\beta$ is the current gain. Furthermore, a diode device having a relatively low leakage current when operated below a turn on voltage thereof is desired.

Accordingly, there is a strong need to provide an improved diode structure and a diode string thereof having reduced substrate leakage current during operations.

SUMMARY OF INVENTION

The primary objective of the present invention is to provide an electrostatic discharge (ESD) protection device, which is compatible with standard Bipolar/BiCMOS manufacturing processes and has low leakage.

Another objective of the present invention is to provide a diode device and a diode string thereof for an ESD protection circuit. The diode device according to the present invention has an open base parasitic PNP bipolar transistor, resulting in reduced substrate leakage current of the diode string.

Still another objective of the present invention is to provide a low-leakage ESD protection diode device that is applicable to power clamp circuits, ESD protection circuit between power pads, or trigger circuit design.

In accordance with the claimed invention, a diode device for an electrostaticdischarge (ESD) protection circuit includes a P-type substrate, a buried N$^+$ heavily doped semiconductor layer implanted in the P-type substrate and bounded by a deep trench isolation, a P well disposed above the buried N$^+$ heavily doped semiconductor layer in the P-type substrate and isolated from the P-type substrate by the deep trench isolation. A P$^+$ doped region, which serves as an anode of the diode device, is located in the P well. A N$^+$ doped region, which serves as a cathode of the diode device, is laterally disposed in the P well and spaced apart from the P$^+$ doped region. The P$^+$ doped region, the buried N$^+$ heavily doped semiconductor layer, and the P-type substrate constitute an open base parasitic PNP bipolar transistor.

Other objects and novel features of the claimed invention will become more clearly and readily apparent from the following detailed description when taken in conjunction with the accompanying drawings.

DETAILED DESCRIPTION

Figure 1:
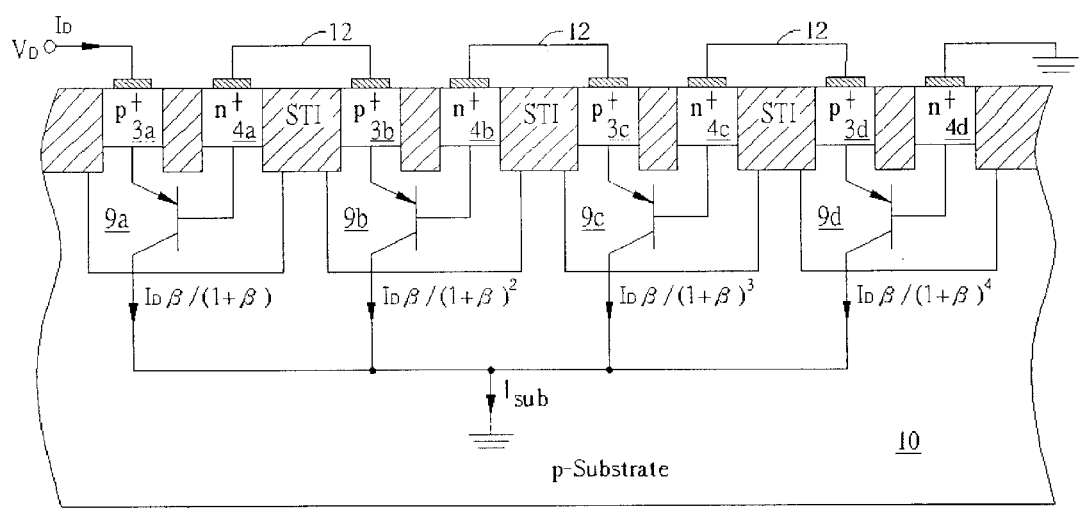
FIG. 1 is a cross-sectional view of a conventional diode clamp structure.
Figure 2:
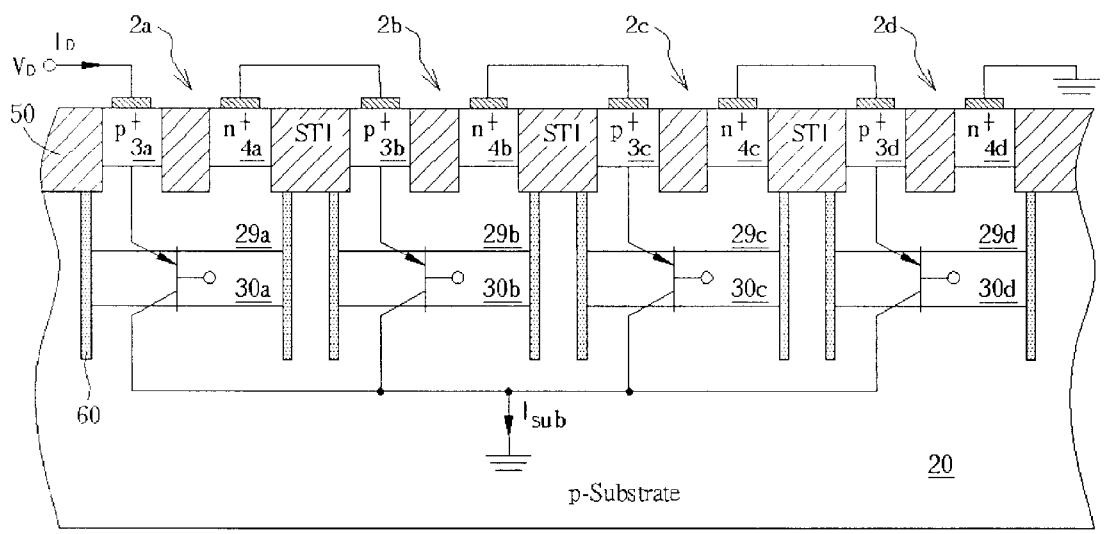
FIG. 2 is a cross-sectional view of a diode clamp structure according to one preferred embodiment of this invention.

Please refer to FIG. 2. FIG. 2 is a cross-sectional view of a diode clamp structure according to one preferred embodiment of this invention. As shown in FIG. 2, a four-stage diode string, which is made up of four isolated diodes 2a~2d coupled in series, is taken as an example. The diode string is shown consisting of a set of separate diode structures 2a~2d disposed in substrate 20. Each diode structure includes a P$^+$ diffusion region (P$^+$: 3a~3d) and a N$^+$ diffusion region ($N^+$: 4a~4d) disposed in a floating P-well 29a~29d, respectively. Each of the four separate P-well regions 29a~29d are bounded by a deep trench isolation 60 in P-type substrate 20. Under each of the P-well regions 29a~29d, there is provided a buried $N^+$ semiconductor region (30a~30d, respectively), which is also bounded by the deep trench isolation 60. By way of example, the first diode in the series comprises diffusion regions 3a and 4a, with $P^+$ diffusion region 3a being coupled to a drain voltage $V_D$ or a peripheral power supply Vccp. It is noted that the diffusion regions 3a and 4a are formed in the floating P-well 29a, which is located above the buried $N^+$ doped semiconductor layer 30a, whereby forming an open base parasitic PNP bipolar transistor. Each of the $P^+$ region (3a~3d) is isolated from the $N^+$ region (4a~4d) by a shallow trench isolation (STI) region 50, which is about 0.3 to 0.5-micrometer thick. Each of the floating P well 29a~29d and each of the buried $N^+$ doped semiconductor layers 30a~30d of a single diode is isolated by the deep trench isolation 60 from adjacent diodes. The deep trench isolation 60 has a depth of about 4 micrometers to about 5 micrometers, which is far deeper than the depth of the overlying STI regions 50.

Likewise, the series connection of separate diodes 2a~2d, which comprise the diode clamp, are coupled together using any available metal layer. The metal connections are always from the $N^+$ region of the previous diode stage to the $P^+$ region of the next stage; that is, $N^+$ region 4a is coupled to $P^+$ region 3b, $N^+$ region 4b is coupled to $P^+$ region 3c, and so on. At the cathode terminal of-the diode clamp, $N^+$ region 4d is grounded or coupled to an internal power supply Vcc. In accordance with the invention, the $P^+$ region and the $N^+$ region are formed in an isolated floating P well, which is located above an isolated buried $N^+$ doped semiconductor layer. With such configuration, an open base parasitic PNP bipolar transistor is created during operations. It is advantageous to use a diode structure having such open base parasitic PNP bipolar transistor because significant substrate leakage current will not be presented until a turn-on voltage (or a voltage greater than the turn-on voltage) is applied on the anode of the diode string. That is, according to the present invention, the turn-on voltage of a diode string is substantially proportional to the number of diodes in the string. This property (turn-on voltage of a diode string being proportional to the number of diodes in the string) is particularly of benefit to IC designers.

Figure 3:
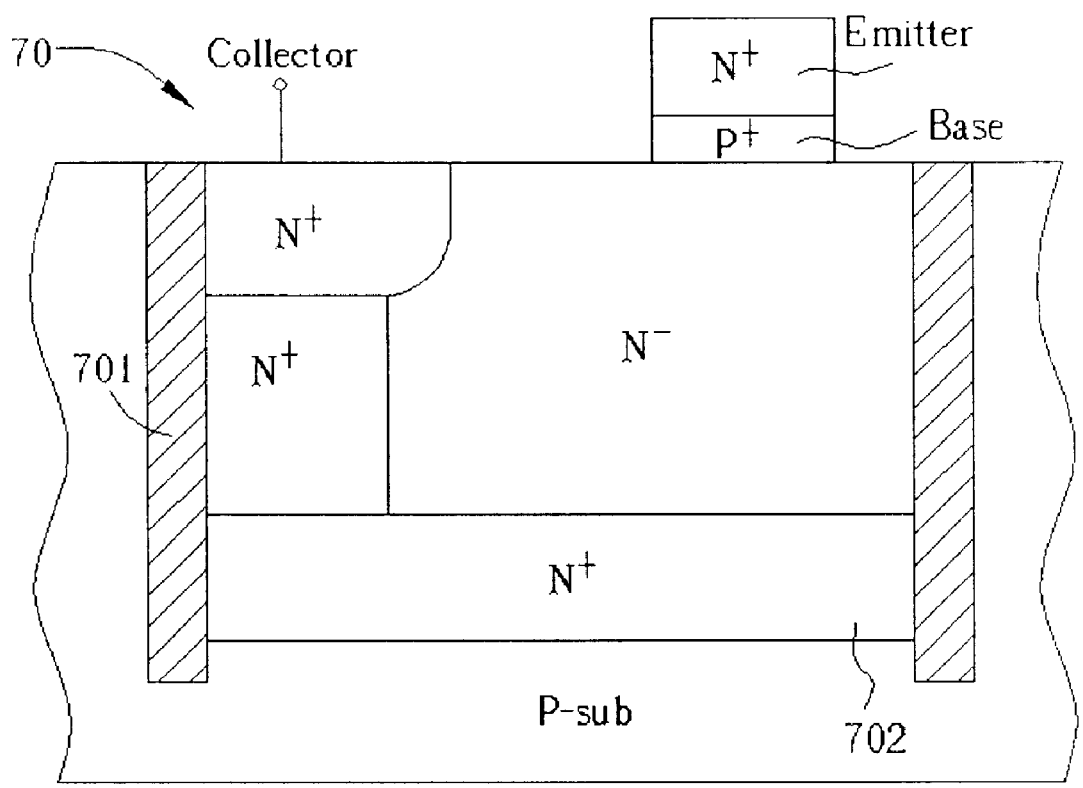
FIG. 3 is a cross-sectional view schematically depicting a typical bipolar device.

The present invention also features its compatible structure with standard Bipolar/BiCMOS or SiGe-BiCMOS manufacturing processes. As mentioned, the diode structure of this invention comprises the buried $N^+$ semiconductor layer and deep trench isolation (about 4~5-micrometer deep), which, as known by those skilled in the art, are both commonly used devices in the manufacture of a Bipolar/BiCMOS device. Referring to FIG. 3 with reference to FIG. 2, where FIG. 3 is a cross-sectional view schematically depicting a typical bipolar device 70, the bipolar device 70 comprises a deep trench isolation 701 region (about 4~5-micrometer deep) and a buried $N^+$ doped semiconductor layer 702. The manufacture of the bipolar device 70 is known in the art and the detailed discussion thereof is thus omitted. It is known that the buried $N^+$ doped semiconductor layer 702 is used to reduce collector resistance of the bipolar device 70 and one of the purposes of the deep trench isolation 701 region is to eliminate substrate noise. From the aspect of the diode according to the present invention, the buried $N^+$ doped semiconductor layer 30a~30d (acting as a base) can bring out the benefit of lowering the current gain β, thereby reducing the substrate leakage current of the diode string (small I_ceo current).

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A diode device for an electrostaticdischarge (ESD) protection circuit, the diode device comprising:
    a P-type substrate;
    a buried $N^+$ heavily doped semiconductor layer implanted in the P-type substrate and bounded by a deep trench isolation;
    a P well disposed above the buried $N^+$ heavily doped semiconductor layer in the P-type substrate and isolated from the P-type substrate by the deep trench isolation;
    a $P^+$ doped region, functioning as an anode of the diode device, located in the P well; and
    a $N^+$ doped region, functioning as a cathode of the diode device, laterally disposed in the P well and spaced apart from the $P^+$ doped region;
    wherein the $P^+$ doped region, the buried $N^+$ heavily doped semiconductor layer, and the P-type substrate constitute an open base parasitic PNP bipolar transistor.

2. The diode device for an electrostaticdischarge protection circuit according to claim 1 wherein the deep trench isolation has a depth of about 4 micrometers to about 5 micrometers.

3. The diode device for an electrostaticdischarge protection circuit according to claim 1 wherein the $N^+$ doped region is isolated from the $P^+$ doped region by a shallow trench isolation (STI) region.

4. The diode device for an electrostaticdischarge protection circuit according to claim 3 wherein the STI region is about 0.3 to 0.5-micrometer thick.

5. A multi-stage diode string structure compatible with Bipolar/BiCMOS manufacturing processes, comprising:
    a plurality of diodes in series connection formed in a P-type substrate, each of the plurality of diodes comprising:
        a buried $N^+$ heavily doped semiconductor layer implanted in the P-type substrate and bounded by a deep trench isolation;
        a P well disposed above the buried $N^+$ heavily doped semiconductor layer in the P-type substrate and isolated from the P-type substrate by the deep trench isolation;
        a $P^+$ doped region, functioning as an anode of the diode device, located in the P well; and
        a $N^+$ doped region, functioning as a cathode of the diode device, laterally disposed in the P well and spaced apart from the $P^+$ doped region.

6. The multi-stage diode string structure according to claim 5 wherein the $N^+$ doped region of the one diode stage of the serially connected diodes is electrically connected to the $P^+$ doped region of a subsequent stage.

7. The multi-stage diode string structure according to claim 5 wherein the $P^+$ doped region of a first diode of the multi-stage diode string structure is coupled to a voltage $V_D$ or a peripheral power supply Vccp.

8. The multi-stage diode string structure according to claim 5 wherein the $P^+$ doped region, the buried $N^+$ heavily doped semiconductor layer, and the P-type substrate constitute an open base parasitic PNP bipolar transistor.

9. The multi-stage diode string structure according to claim 5 wherein the deep trench isolation has a depth of about 4 micrometers to about 5 micrometers.

10. The multi-stage diode string structure according to claim 5 wherein the $N^+$ doped region is isolated from the $P^+$ doped region by a shallow trench isolation (STI) region.

11. The multi-stage diode string structure according to claim 10 wherein the STI region is about 0.3 to 0.5-micrometer thick.

* * * * *